(12) United States Patent
Tian et al.

(10) Patent No.: US 7,541,838 B2
(45) Date of Patent: Jun. 2, 2009

(54) TRANSMITTER SWING CONTROL CIRCUIT AND METHOD

(75) Inventors: Kathy Tian, Sunnyvale, CA (US); Harry Muljono, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/729,209

(22) Filed: Mar. 27, 2007

(65) Prior Publication Data
US 2008/0238482 A1 Oct. 2, 2008

(51) Int. Cl.
*H03K 19/094* (2006.01)
*H03K 19/0175* (2006.01)

(52) U.S. Cl. .......................... 326/83; 330/252; 348/723

(58) Field of Classification Search ................... 326/68, 326/80, 83, 86, 87, 112, 115, 126, 127; 327/108, 327/109, 333
See application file for complete search history.

(56) References Cited

U.S. PATENT DOCUMENTS

| | | | |
|---|---|---|---|
| 6,803,820 B1 | 10/2004 | Muljono | |
| 6,898,741 B2 | 5/2005 | Muljono | |
| 7,036,055 B2 | 4/2006 | Muljono | |
| 7,057,672 B2 * | 6/2006 | Sandhu et al. | 348/723 |
| 7,069,455 B2 | 6/2006 | Muljono | |
| 7,091,757 B2 * | 8/2006 | Masuda | 327/122 |
| 7,193,467 B2 * | 3/2007 | Garlepp et al. | 330/259 |
| 7,288,967 B2 * | 10/2007 | Byun et al. | 326/83 |
| 2003/0085736 A1 * | 5/2003 | Tinsley et al. | 326/81 |
| 2007/0071111 A1 * | 3/2007 | Muljono et al. | 375/257 |
| 2007/0075776 A1 * | 4/2007 | Garlapati et al. | 330/259 |
| 2007/0139070 A1 | 6/2007 | Tian | |

OTHER PUBLICATIONS

U.S. Appl. No. 11/772,193 entitled "Link Transmitter Swing Compensation" filed Jun. 30, 2007.

* cited by examiner

*Primary Examiner*—Rexford Barnie
*Assistant Examiner*—Dylan White
(74) *Attorney, Agent, or Firm*—Erik R. Nordstrom

(57) ABSTRACT disclosed herein are embodiments of a swing compensation scheme for compensating errors in a transmitter driver.

9 Claims, 3 Drawing Sheets

US 7,541,838 B2

TRANSMITTER SWING CONTROL CIRCUIT AND METHOD

BACKGROUND

Chip-to-chip communication is commonly implemented with high-speed, point-to-point links such as with differential point-to-point links transmitting differential data signals. Achievable data rates can be affected by voltage and timing margins of the transmitted signals. For example, deviations from specified transmitted voltage swings during operation can result in decreased margins and therefore a decreased data-rate. Unfortunately, it is difficult to control voltage swing levels because they vary with operating environment changes such as with changes in PVT (process, voltage, and temperature). Because PVT changes generally affect the various transmitter circuits within a chip the same, chips typically incorporate one or more distributed general compensation circuits to control multiple transmitter circuits reasonably proximal to the compensation circuit to compensate for such PVT variations.

FIG. 1 shows a conventional multi-bit point-to-point link with global current compensation (I-Comp) and termination resistance compensation (R-Comp) to control (e.g., keep reasonably constant) drive currents and termination resistances in accordance with design specifications. It comprises N transmitter drivers 101 to be coupled to N corresponding receivers (e.g., on a different chip, not shown). Each driver has an associated pair of variable termination resistors to convey differential data signals (Dini, Dini#). Also included is a global current compensation (I-Comp) circuit 103, which uses a reference current (I-Ref) to generate and distribute multiple copies of current, $I_1$ through $I_N$, to each individual TX driver (Tx1 to TxN). The current is used to generate a desired output swing that is also affected by the values of the termination resistors. A global resistance compensation (R-Comp) circuit 105 is also included to generate resistance compensation signals from an R-Ref control resistor.

Unfortunately, however, within-die systematic and random process variations between the compensation circuits and the transmitter circuits they service, as well as between the transmitter circuit instances themselves, can undue some of the compensation achieved by the general compensation circuits. Thus, using such compensation circuits can still result in errors in the transmitter output voltage swing and thereby decrease the voltage margin available at the receiver decreasing achievable data rates. Accordingly, new solutions are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
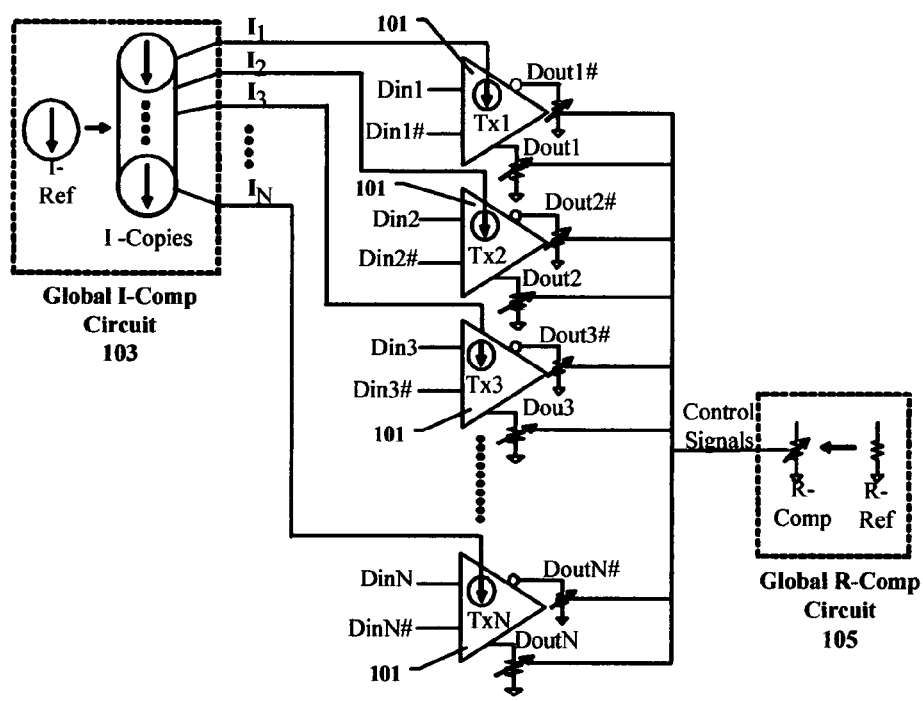
FIG. 1 is a schematic diagram of a conventional multi-bit, point-to-point link with global transmitter driver compensation.
Figure 2:
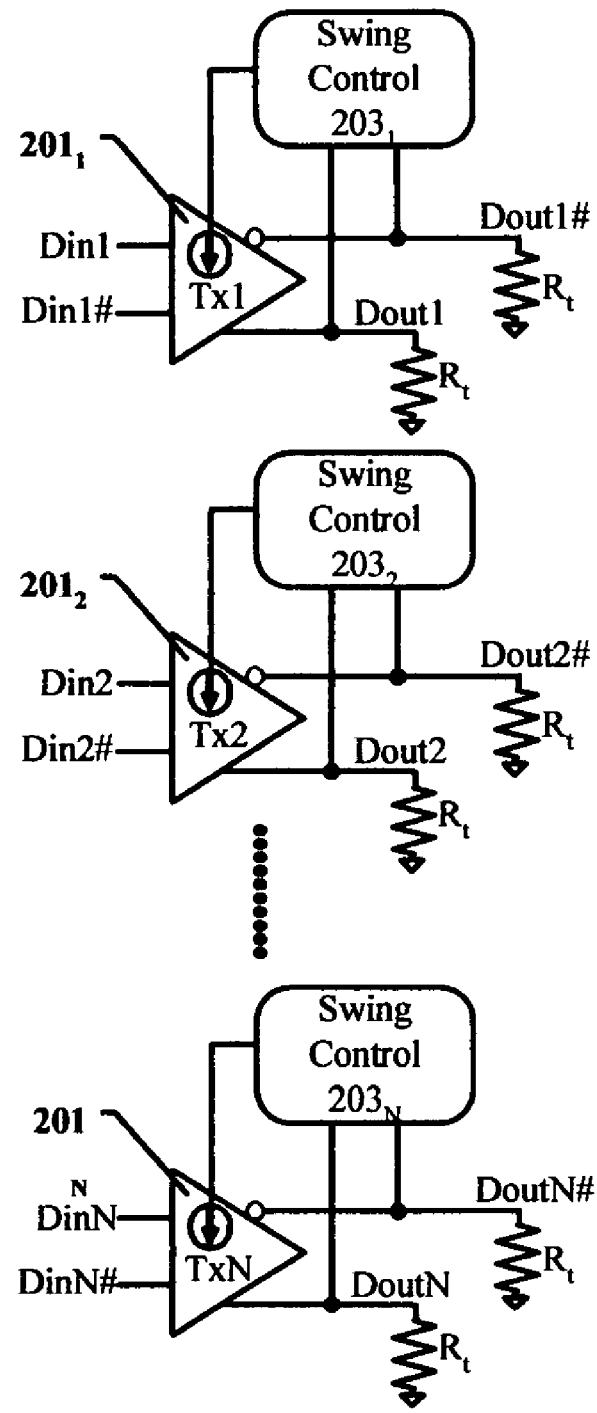
FIG. 2 is a schematic diagram of a multi-bit, point-to-point link with per-lane transmitter driver-current compensation in accordance with some embodiments.

FIG. 2 shows N differential transmitter drivers ($201_1$ to $201_N$) for a multi-bit point-to-point communications link. Each driver has differential inputs (Dini, Dini#) to receive a differential data input signal and a differential output (Douti, Douti#) coupled to termination resistors $R_t$ to provide a differential output signal to be transmitted, e.g., off-chip to a corresponding receiver.

Each driver circuit also has an associated swing control circuit $203_i$ coupled between its output nodes and a current source controlling its strength to control the current source for an output swing within a desired tolerance. In some embodiments, the swing control circuit differentially measures a test output, in both directions (i.e., Douti/Douti# and Douti#/Douti) to compensate for fluctuations in either termination resistor, as well as in either side of the differential driver amplifier. It may be done dynamically, e.g., on an operating test clock, which may also enhance its accuracy. (Note that while in the depicted embodiment, neither global current nor global resistance compensation is shown; however, either or both global current and resistance compensation circuits may or may not be included with the use of local swing control circuits disclosed herein.)

Figure 3:
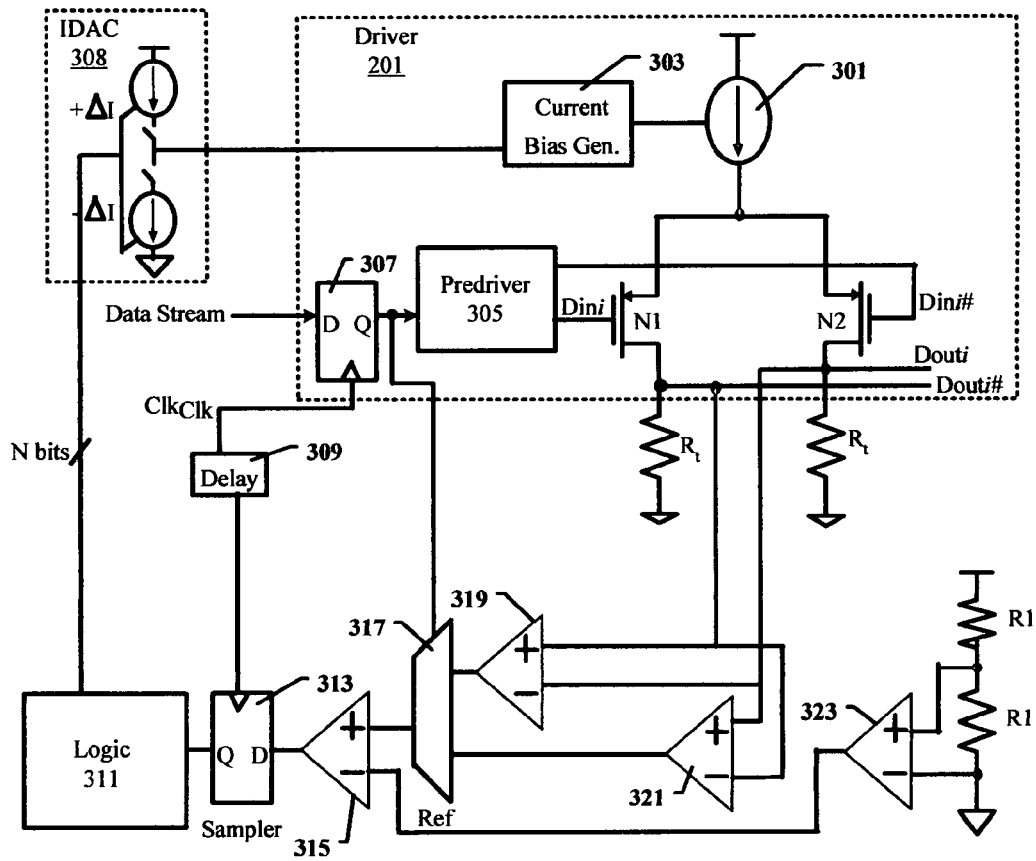
FIG. 3 is a schematic diagram of a swing control circuit to control voltage swing for a differential transmitter in accordance with some embodiments.

FIG. 3 shows an exemplary swing control circuit 203 coupled to a differential transmitter driver 201. The driver circuit 201 comprises transistors N1, N2, adjustable current source 301, current bias generator 303, pre-driver 305, and latch 307, all coupled together as shown. The predriver 305 converts a single-ended data stream, from latch 307, to a corresponding differential input signal (Dini, Dini#) to be driven through transistors N1 and N2 onto termination resistors $R_t$ as shown. The current bias generator 303 controls the strength of current source 301, which thereby allows it to control the strength of the differential amplifier formed from N1 and N2. Thus, by increasing or decreasing current in the bias generator, the output swing (magnitude of Douti/Douti#) can correspondingly be adjusted.

The swing control circuit 203 is coupled to the current bias generator 303 to increase or decrease its current in order to correspondingly adjust current source 301 to maintain the output swing within a desired range. The swing control circuit 203 generally comprises current-mode digital-to-analog converter (IDAC) 308, clock delay 309, logic 311, sampler latch 313, comparator 315, multiplexer 317, linear amplifiers 319 to 323, and resistors R1, all coupled together as shown.

Resistors R1 are coupled between a supply voltage (e.g., the supply used to power driver 201) and to amplifier 321 to generate a reference (VCC/2 in the depicted embodiment) buffered and provided at the output of Amplifier 323. It corresponds to the target swing magnitude and is thus coupled to the negative input of comparator 315 to function as a reference against the actual swing magnitude (measured in either direction).

Linear amplifiers 319, 321 are coupled to the output nodes (Douti, Douti#) to measure the differenced between them in each direction, i.e., Douti/Douti# (D+/D−) and Douti#/Douti (D−/D+). The output from each amplifier (319, 321) is coupled to one of the inputs of 2:1 multiplexer 317. In the depicted embodiment, the select control line for multiplexer 317 is coupled to the output of latch 307. In this way, depending on the input data value, the appropriate amplifier (319 when N2 is active or 321 when N1 is the active transistor) is selected to provide to amplifier 315 the appropriate difference (D+/D− or D−/D+). (Note that the multiplexer could be controlled from any desired block, e.g., it could be controlled by the logic 311.) Thus, D+/D− and D−/D+ can be separately tuned (or calibrated).

The output from multiplexer 317 is coupled to a comparator (which may be implemented with a wide mode type amplifier), where it is compared against the target reference. If it is smaller than the reference, then a '0 is output from the comparator, and if it is greater than the reference, then a '1 is output from it.

The delay circuit 309 serves to clock the comparison result through sample latch 313 after a delay (e.g., ¼ clock cycle) from when the data was clocked to predriver 305. Such a delay may be used to ensure that an accurate sample, taking into account rise/fall times, is obtained. The latched value, indicating if the difference is too small or too large, is provided to logic 311. Logic 311 may include appropriate logic, e.g., counter(s), finite state machine, averaging circuitry, to provide an N-bit digital control signal to IDAC 308 to appropriately increase, decrease, or maintain the strength of the driver 201 in response to the difference between D+/D− and the reference, as well as between D−/D+ and the reference value. For example, in some embodiments, it could comprise logic to control a 5-bit up/down counter to provide a 5-bit control signal to IDAC 308.

An exemplary operation for the circuitry of FIG. 3 will now be discussed initially, before the error for either swing direction is determined, the logic 311 sets its counter (used to control IDAC 305) to a midway value (e.g., '10000 for a 5-bit counter. Next, the swing error (or needed compensation) for a first swing direction (e.g., D+/D−) is determined. To do this, a test data stream (e.g., a toggling data stream at an operational rate such as 6.4 GHz.) may be clocked through latch 307 to predriver 305. Assume that the D+/D− swing error is to initially be determined. This corresponds to N2 being turned on harder than N1, which occurs when the input data is '0, i.e., N2 is turned on and N1 is turned off.

The logic 311 receives from the sampler latch 313 a digital value indicating whether the D+/D− swing difference is too high or too low. If too high, it decrements the counter to decrease driver strength and if too low, it increments the counter to increase counter strength. It does this over multiple clock cycles, if necessary, until the D+/D− swing magnitude is sufficiently close to its desired (e.g., target reference) value. The count value used to achieve this is retained in memory within the logic 311.

Next, the same process is repeated for the D−/D+ swing difference. In some embodiments, the obtained compensation count value is then averaged with the saved count value for the D+/D− polarity, and the result is applied to IDAC 305 for normal transmission operations.

Figure 4:
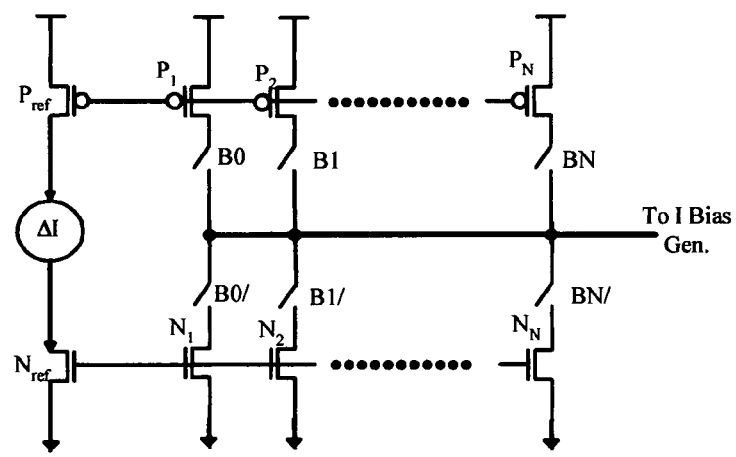
FIG. 4 is a schematic diagram of a current-mode digital to analog converter in accordance with some embodiments.

FIG. 4 shows an exemplary IDAC circuit 305. It generally comprises reference transistors $P_{ref}$, $N_{ref}$ and N P-type and N-N-type transistors, and switching circuitry, coupled together as shown. (The value of N corresponds to the number of bits from the logic 311 used to control current generated in IDAC 305.) The transistors are all controllably coupled to a common IDAC output that is supplied to the current bias generator 303. In the depicted embodiment, associated P and N transistors are configured into complementary pairs, and the pairs are binary weighted with respect to one another. In the depicted embodiment, P1 and N1 are the least significant (smallest) transistors, while $P_N$ and $N_N$ are the most significant (strongest) transistors. Thus, the P2 transistor is twice the strength of P1, P3 is twice the strength of P2, and so on. In this way, $2^N$ different discrete current levels can be achieved in response to the N-bit signal from logic 311.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
    a differential transmitter driver having a differential output; and
    a swing control circuit coupled to the differential transmitter driver to compensate the driver based on first and second output direction swing levels taken from the differential output, the swing control circuit including first and second amplifiers coupled to the differential output to provide the first and second output direction swing levels, wherein the first and second amplifiers are selectably coupled to a comparator having a target reference to be compared against a selected one of the first and second output direction swing levels to generate a comparison error result.

2. The chip of claim 1, in which the comparator is coupled to a latch to provide it with the comparison error result.

3. The chip of claim 2, comprising a delay element coupled to the latch to control when it latches the comparison result.

4. The chip of claim 3, comprising logic to receive the latched comparison result an control the differential transmitter driver based on the comparison result.

5. The chip of claim 1, comprising logic to control the driver based on an average of the taken first and second output direction swing levels.

6. A chip, comprising:
    a differential transmitter driver having a current source to control the strength of the driver and a differential output with a first termination resistor coupled to a first output node and a second termination resistor coupled to a second output node; and
    a swing compensation circuit coupled to the current source and first and second output nodes to control the current source based on a voltage difference between the first and second output nodes when the first node voltage is higher than the second node voltage, wherein the current source is further controlled based on a voltage difference between the second and first output nodes when the second node voltage is greater than the first output node voltage and wherein the swing control circuit comprises first and second amplifiers coupled to the first and second output nodes to amplify the differences between the first and second and second and first output nodes and wherein the first and second amplifiers are selectably coupled to a comparator having a target reference to be compared against a selected one of the voltage differences to generate a comparison error result.

7. The chip of claim 6, in which the voltage differences between the first and second and second and first nodes is taken while the transmitter driver is driving a data signal toggling at a frequency within an operating range of the driver.

8. The chip of claim 6, in which the comparator is coupled to a latch to provide it with the comparison error result.

9. The chip of claim 8, comprising a delay element coupled to the latch to control when it latches the comparison result.

* * * * *